United States Patent
Yan

(10) Patent No.: US 7,134,062 B2
(45) Date of Patent: Nov. 7, 2006

(54) STATIC TIMING ANALYSIS APPROACH FOR MULTI-CLOCK DOMAIN DESIGNS

(75) Inventor: Fei Yan, San Diego, CA (US)

(73) Assignee: Via Telecom, Inc., San Diego, CA (US)

( * ) Notice: Subject to any disclaimer, the term of this patent is extended or adjusted under 35 U.S.C. 154(b) by 426 days.

(21) Appl. No.: 10/639,701

(22) Filed: Aug. 12, 2003

(65) Prior Publication Data

US 2005/0039094 A1 Feb. 17, 2005

(51) Int. Cl.
G01R 31/28 (2006.01)

(52) U.S. Cl. .......................... 714/731; 716/6

(58) Field of Classification Search ............... 702/79; 713/503; 716/10, 12, 6; 370/342; 714/725, 714/729, 731
See application file for complete search history.

(56) References Cited

U.S. PATENT DOCUMENTS

| | | | |
|---|---|---|---|
| 5,761,097 A * | 6/1998 | Palermo | 702/79 |
| 5,771,375 A * | 6/1998 | Mains | 713/503 |
| 6,272,668 B1 * | 8/2001 | Teene | 716/10 |
| 6,609,241 B1 * | 8/2003 | Yonemori | 716/12 |
| 6,658,635 B1 * | 12/2003 | Tanimoto | 716/6 |
| 6,693,890 B1 * | 2/2004 | Yick et al. | 370/342 |
| 6,851,098 B1 * | 2/2005 | Schultz | 716/6 |
| 6,874,108 B1 * | 3/2005 | Abramovici et al. | 714/725 |

OTHER PUBLICATIONS

"Standard Delay Format Specification", Version 3.0, May 1995, Open Verilog International, 104 pages.
"Prime Time Specific Setup", Oct. 1999, LSI Logic Corporation, Paragraphs, 9-11 and 18-19, 17 pages.

* cited by examiner

*Primary Examiner*—David Ton
(74) *Attorney, Agent, or Firm*—Christopher P. Maiorana, PC

(57) ABSTRACT

A method for analyzing a circuit design is disclosed. The method generally includes the steps of (A) determining a plurality of paths from a first clock at a first location to a plurality of second clocks at a plurality of second locations in the circuit design, (B) calculating a plurality of delays along the paths and (C) calculating a plurality of latencies with respect to the first clock for the second clocks using the delays.

27 Claims, 3 Drawing Sheets

STATIC TIMING ANALYSIS APPROACH FOR MULTI-CLOCK DOMAIN DESIGNS

FIELD OF THE INVENTION

The present invention relates to digital circuit analysis generally and, more particularly, to a static timing analysis approach for multi-clock domain designs.

BACKGROUND OF THE INVENTION

As application specific integrated circuit (ASIC) designs continue to advance in both performance and complexity, the designs become more susceptible to timing problems. In turn, more effort and time is spent on static timing analysis to understand the timing relationships of the various clocks generated within the designs. No simple mechanism exists in conventional static timing analysis tools to accurately define the clock relationships in the designs. Clock timing relationship analysis commonly becomes a manual process introducing inaccuracies and translation mistakes that result in timing errors in the design. The manual analysis problems are amplified further if predefined clocks are used in both pre-layout and post-layout analyses, where multiple clocks are defined through the process of consistent and accurate extraction of clock information from an estimated pre-layout standard delay format (SDF) file or a post-layout SDF file.

For complex ASIC designs, only experienced ASIC engineers can perform static timing analysis using the existing approaches. The ASIC engineers will prepare clock definitions and constraints (i.e., multi-cycle paths and false paths) for the static timing analysis. Even still, the timing results are easily affected by peculiarities of the tools. The wrong results will be generated if the tool does not understand the clock definitions correctly. Several tools are currently available that are used to perform static timing analysis on entire ASIC designs. Examples of conventional static timing analysis tools are TimeMill®, PrimeTime® and MOTIVE® (all registered trademarks of Synopsys, Inc. Mountain View, Calif.).

SUMMARY OF THE INVENTION

The present invention concerns a method for analyzing a circuit design. The method generally comprises the steps of (A) determining a plurality of paths from a first clock at a first location to a plurality of second clocks at a plurality of second locations in the circuit design, (B) calculating a plurality of delays along the paths and (C) calculating a plurality of latencies with respect to the first clock for the second clocks using the delays.

The objects, features and advantages of the present invention include providing a method and/or an apparatus for a static timing analysis approach for multi-clock domain digital designs that may (i) apply to a static timing analysis of ASIC designs, (ii) provide reliable and accurate static timing analysis data for complex multi-clock designs and/or (iii) minimize timing problems in designs prior to taping out the designs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
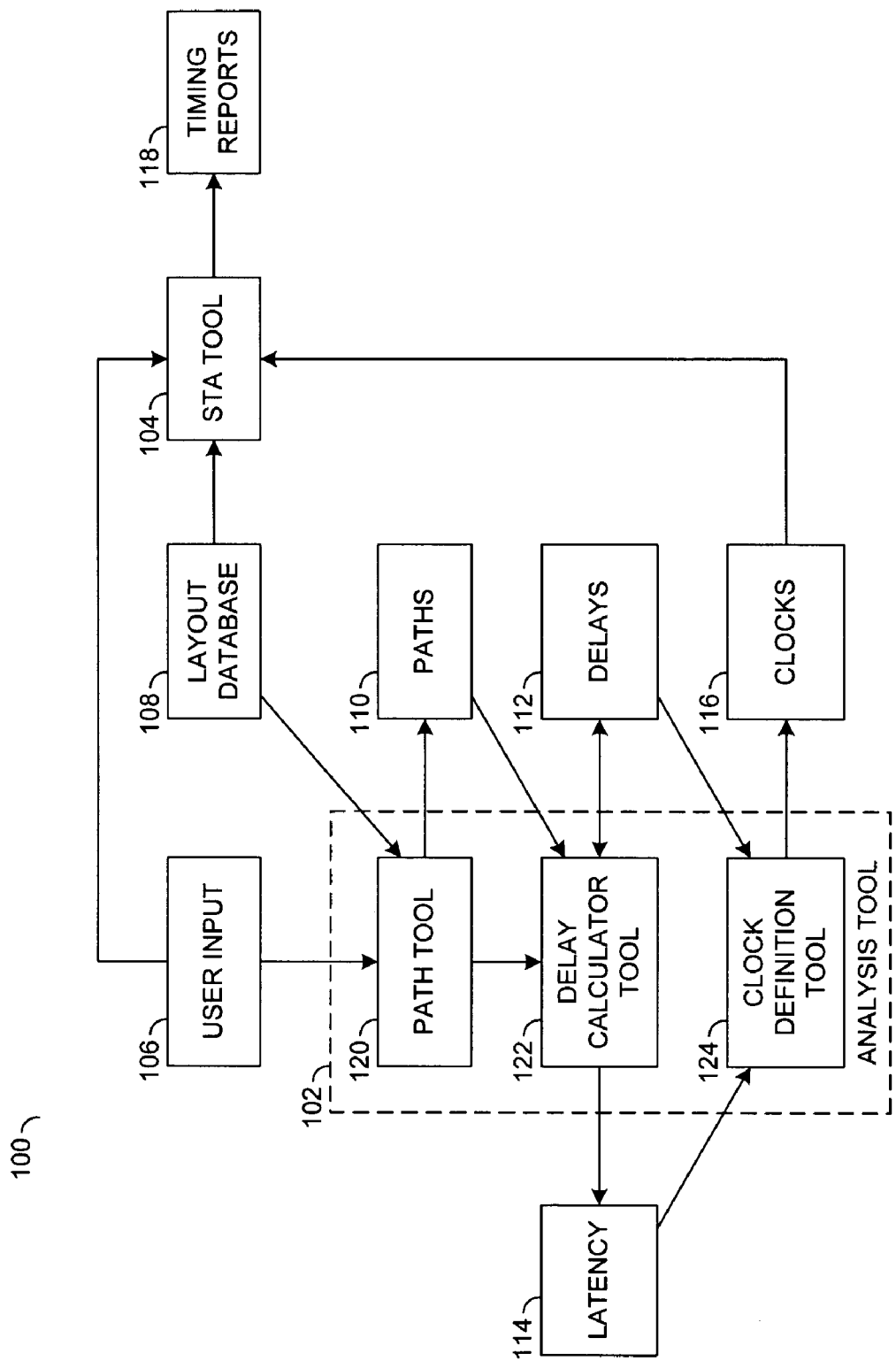
FIG. 1 is a block diagram of an example implementation of an apparatus in accordance with a preferred embodiment of the present invention.

Referring to FIG. 1, a block diagram of an example implementation of an apparatus 100 in accordance with a preferred embodiment of the present invention is shown. The apparatus 100 generally comprises a tool (or subroutine) 102, a tool (or subroutine) 104, a file 106, a file 108, a file 110, a file 112, a file 114, a file 116 and a file 118. The tool 102 may be implemented as an analysis tool or function. The tool 104 may be implemented as a static timing analysis (STA) tool or function. An example of a suitable STA tool 104 may be the PrimeTime® STA tool. The file 106 may be configured to store user-defined parameters, data, timing constraints, library data and other information consumed by the analysis tool 102 and the STA tool 104. The file 108 may be configured to store a pre-layout database and/or post-layout database of a digital circuit design being analyzed. Delay information within the layout database file 108 may be arranged in a standard delay format (SDF). The SDF may be defined by the "Standard Delay Format Specification", Version 3.0, May 1995 by the Open Verilog International organization, Los Gatos, Calif., hereby incorporated by reference in its entirety. The timing reports file 118 may include reports for path timing constraint errors and false paths.

The analysis tool 102 generally comprises a tool (or subroutine) 120, a tool (or subroutine) 122 and a tool (or subroutine) 124. The tool 120 may be implemented as a path tool or function operational to determine one or more paths. The tool 122 may be implemented as a delay calculator tool or function operational to calculate one or more total delays along the paths between any two user-defined points or locations in the digital circuit design. The tool 124 may be a clock definition tool or function operational to define characteristics for valid clock signals within the design.

The path tool 120 may receive the user-defined information from the user input file 106 and the digital circuit design information from the pre-layout or post-layout information in the layout database file 108. The digital circuit design may be, for example, a multi-clock design having many clocks derived from one or more source or root clocks. The path tool 120 may parse the digital circuit design information to determine one or more clock paths requested in the user input file 106. Data for the paths may be generated and stored in the path file 110.

The tool 122 may be implemented as a delay calculator tool operational to calculate one or more delays for each segment or portion of paths saved in the file 112. The delay values saved in the delay file 112 may represent rising time delays and/or falling time delays, pulse widths and other characteristics of the clock signals at user-defined points along the paths stored in the path file 110. As long as the delay values, the pulse widths and/or other characteristics of the clock signals are calculated, the information may be sent back to the delay calculator tool 122 for calculating the clock latencies. The clock latency information may be stored in the latency file 114. The latency file 114 may be presented to the clock definition tool 124 for defining the clock signals. The clock definition tool 124 may write information for each of the clock signals and paths in the clock file 116.

The STA tool 104 is generally the timing engine that may perform a static timing analysis based on the digital circuit design data from the layout database file 108. The analysis may also use the clock definitions stored in the clock file 116 and the digital design constraints stored in the user input file 106. Any additional timing information normally generated by the STA tool 104 and not immediately useful to the analysis tool 102 may be stored in one or more timing reports in the timing reports file 118.

Figure 2:
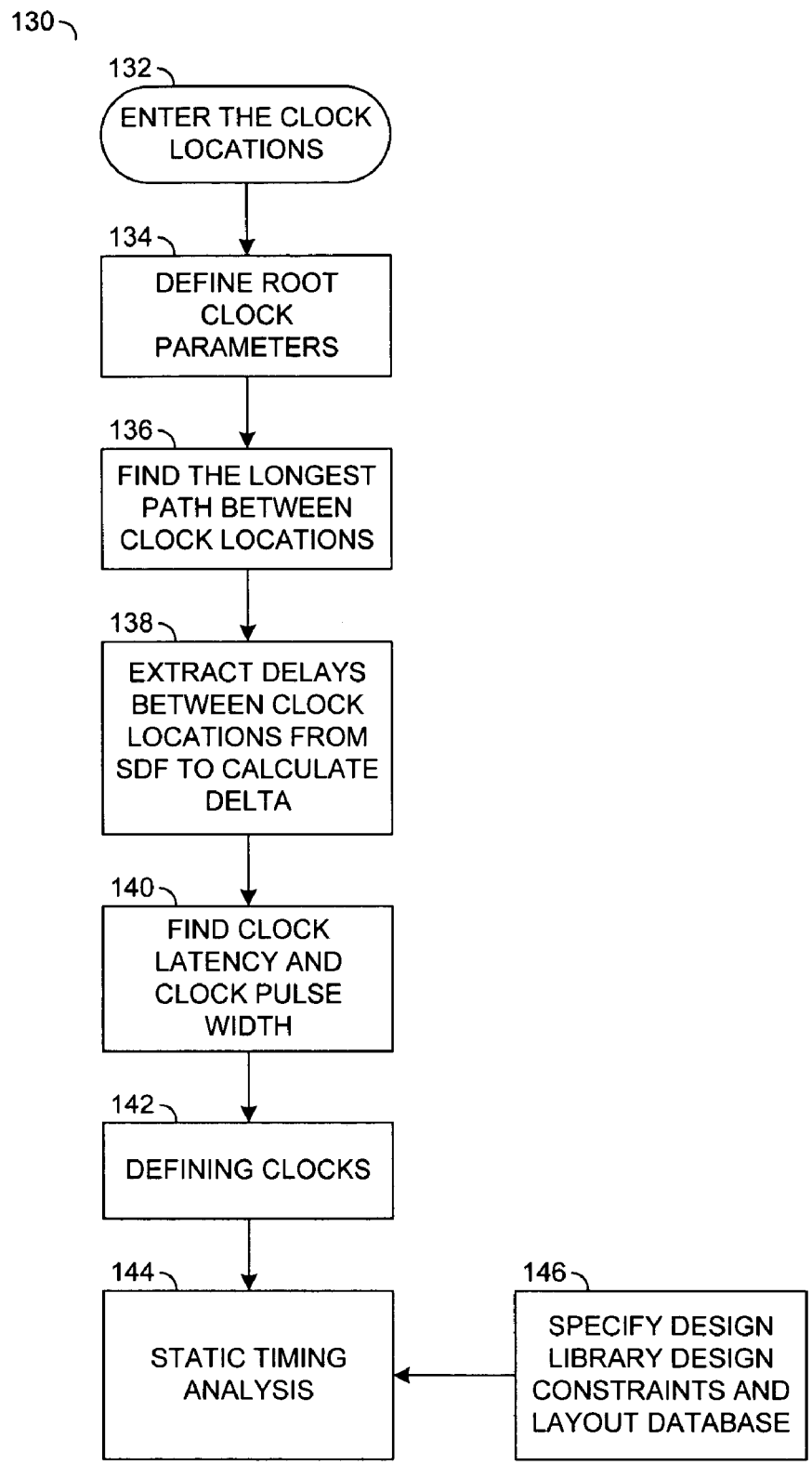
FIG. 2 is a flow diagram of an example method of operation for the apparatus.

Referring to FIG. 2, a flow diagram of an example method of operation 130 for the apparatus 100 is shown. The method 130 generally comprises a step (or block) 132, a step (or block) 134, a step (or block) 136, a step (or block) 138, a step (or block) 140, a step (or block) 142 and a step (or block) 144.

The method 130 may begin with reception of input information from the user input file 106 (e.g., block 132). The user inputs may include one or more clock starting locations (e.g., FROM_POINT), one or more clock ending locations (e.g., END_POINT), and one or more parameters (e.g., T, α, ROOT_RISE and ROOT_FALL) for a clock signal. Each "from" location FROM_POINT may define an initial or starting location from which a clock analysis may be based. Each "to" location END_POINT may define a location along the various clock paths where a clock signal derived from a root clock may be characterized by the analysis. The locations END_POINT may include multiple end locations for the same derived clock signal at different points along a given path.

The root clock or root clocks are generally the source clocks for creating all other clock signals. The root clocks may be used as a reference signal having a known waveform at a particular location in the circuit design. Since the skews of all other derived clock signals may be referenced to the root clock signals, relationships among the derived clock signals may be calculated.

The characteristics for the waveform of the root clock signal may be generated from the parameters provided by the user (e.g., block 134). The root clock signal is generally modeled as an oscillating signal (e.g., a square wave) having a predetermined or fixed period. The period of the root clock signal, in a unit of nanoseconds or the like, may be specified by the user in the parameter T. The parameter α generally defines a ratio of time for the clock signal in a logical high state compared with the period T. The parameter ROOT_RISE may define a rising edge time (or a start time of a rising edge) of the root clock. The parameter ROOT_RISE may be normally set to zero nanoseconds. The parameter ROOT_FALL may define a falling edge time (or a start time of a falling edge) of the root clock. The parameter ROOT_FALL may be normally set to the product αT nanoseconds.

The parameter α generally has a value of 50 percent indicating that the root clock signal may be in the logical high state for half of the period T and in a logical low state for the other half of the period T. Other values for the parameter α may be entered to meet the criteria of a particular application. For example, if the digital circuit design contains falling edge triggered flip-flops, the parameter α may be manually adjusted to 45 percent (e.g., the root clock signal may be in the logical high state for the first 45 percent of the period T and the logical low state for the remaining 55 percent of the period T). Likewise, the parameter α may be set to 55 percent (e.g., the root clock signal may be in the logical high state for the first 55 percent of the period T and the logical low state for the remaining 45 percent of the period T). Other duty cycles may be implemented to meet the criteria of a particular digital circuit design. In one embodiment, the root clock signal may also be defined to start each period T in the logical low state and end in the logical high state.

A model for the root clock signal in an initial cycle may be implemented as a square wave starting at a time set in the parameter ROOT_RISE after a boundary of each period T. A width for the logical high portion of the square wave may be adjusted per the parameters α and T. (e.g., ROOT_WIDTH=αT). Therefore, the parameter ROOT_FALL may be established at a time ROOT_FALL=ROOT_RISE+αT. The root clock signal may remain in the logical low state for the rest of the period T.

An example root clock may be modeled as follows, assuming a 10 nanosecond (ns) period T (100 megahertz) of the root clock signal and a 45 percent duty cycle α, an ideal root clock signal may rise from the logical low state to the logical high state at 0 ns from the start of each period T. At 4.5 ns (e.g., 0.0+0.45*10) after the start of each period T, the root clock signal may fall from the logical high state back to the logical low state and remain in the logical low state for the remaining 5.5 ns. Therefore, an ideal root clock signal may be modeled as a 4.5 ns pulse width starting at the beginning of each 10 ns period.

In another example, given a 2 ns value of the parameter ROOT_RISE, a 55 percent value for α and a 10 ns value for T, the root clock signal may transition from the logical low state to the logical high state 2 ns after the start of each period T. After 7.5 ns (e.g., 2.0+0.55*10) from the start of each period T, the root clock signal may transition from the logical high state to the logical low state. For the remaining 2.5 ns, the root clock signal may stay in the logical low state.

The path tool 120 may determine a longest physical path between the initial location FROM_POINT and each of the ending locations END_POINT (e.g., block 136). The path tool 120 may also generate the path file 110 to store the longest path information. The path file 110 may be presented to the delay calculator tool 122 for delay calculations along each piece of the paths.

The delay calculator tool 122 may be further operational to use the path information from the path file 110 to calculate individual time delays between various nodes and elements of the digital circuit design (e.g., block 138). A script (e.g., written in a Tcl language used in the STA tool 104) may be executed to extract the delays from the layout database 108 and the delay file 112 to calculate one or more time delays between the points. The delays may be rising edge delays and falling edge delays. Example time delays may include, but are not limited to propagation delays along connection wires, delays through logic gates, delays through a flip-flop (e.g., from a clock input pin of the flip-flop to an output pin of the flop-flop), buffer delays, delays through multiplexers and the like. Calculating delays for both rising edges and falling edges may account for asymmetrical transfer characteristics for some active circuitry. The path information within the path file 110 may be used by the delay calculator tool 122 to generate the clock latency data which is subsequently stored in the latency file 114. The delay file 112 may then be updated based upon the calculations.

The delay calculator tool 122 may be operational to calculate total rise time latencies and total fall time latencies from any given starting location FROM_POINT to any given end location END_POINT along the identified paths. Generally, the delay calculator tool 122 may be configured to calculate a first arrival time (e.g., ARRIVAL_TIME1) in nanoseconds at each of the initial locations FROM_POINT (e.g., block 140) for a clock pulse edge (e.g., leading edge or trailing edge) initiated at a predetermined starting location at a particular time and measured against a root clock. The delay calculator tool 122 may also calculate a second arrival time (e.g., ARRIVAL_TIME2) in nanoseconds at each of the end locations END_POINT (e.g., block 140) for the clock pulse edge as measured against the root clock. The delay calculator tool 122 may then determine a time difference value (e.g., DELTA) as a difference between the first arrival time ARRIVAL_TIME1 and the second arrival time ARRIVAL_TIME2 (e.g., block 140). The value DELTA, the root clock parameters (T, ROOT_FALL and ROOT_WIDTH received from the path tool 120) and characteristics of the derived clock signals may be stored as part of a latency report stored in the latency file 114. The latency file 114 may be generated by the delay calculator tool 122 (e.g., block 140).

The clock definition tool 124 may use the latency information from the latency report and the data from the delay file 112 to generate definitions for each clock signal (e.g., block 142). The clock definitions may then be presented to the STA tool 104 along with information from the layout database 108 and possibly one or more user parameters from the user input file 106. The STA tool 104 may perform a static timing analysis (e.g., block 144) to produce the reports in the timing reports file 118. The static timing analysis may receive design constraints and the layout database information as additional inputs (e.g., block 146).

As indicated above, the delay calculator tool 122 may determine the pulse widths, rise latencies and fall latencies of the derived clocks. As other derived clocks may be created from the root clock, the rising edges and the falling edges of the derived clock signals may be propagated from the particular location of the root clock along the longest paths to the various user-defined end locations END_POINT. A rise propagation delay (or rise latency) for a representative derived clock "n" relative to the root clock may be defined as a time delay from a first arrival time of a rising edge at the root clock location until a second arrival time of the rising edge at the derived clock n location (e.g., CLKn_RISE=ROOT_TO_CLK_RISE). A fall propagation delay (or fall latency) for the representative derived clock n relative to the root clock may be defined as a time delay from a first arrival time of a falling edge at the root clock location until a second arrival time of the falling edge at the derived clock n location (e.g., CLKn_FALL=ROOT_TO_CLK_FALL). A width of the derived clock n signal at the end location may be defined as a change in the root clock width due to the rise latency and the fall latency (e.g., CLKn_WIDTH=ROOT_WIDTH+ CLKn_FALL−CLKn_RISE).

The latency of each of the derived clocks may be generated by executing a script process of the delay calculator tool 122 as part of blocks 138 and 140. Example implementations of procedures written in the Tcl script to calculate the rise time delays and fall time delays are generally provided as follows:

```
# Title: get_segment_delay_max_rise.proc#
# Description: The procedure provides a max_rise delay
#              calculation between a "from" point and a "to" point

# Usage: pt_shell> source get_segment_delay_max_rise.proc
```

```
#       pt_shell> get_segment_delay_max_rise -from from_point
#       -to to_point

proc get_segment_delay_max_rise { args } {
set results(-from) "NULL"
set results(-to) "NULL"
parse_proc_arguments -args $args results
set frompoint $results(-from)
set topoint $results(-to)
set dtype "max_rise"
set delta_time 0
set from_time 0
set to_time 0
if { $frompoint == "NULL" } {
    set mypath [get_timing_paths -to $topoint -delay_type $dtype
-max_path 1]
} else {
    set mypath [get_timing_paths -from $frompoint -to $topoint
-delay_type $dtype -max_path 1]
}
echo "Number of paths is [sizeof_coll $mypath]"
set pts [get_attribute $mypath points]
foreach_in_collection pt $pts {
    set ptname [get_attribute [get_attribute $pt object] full_name]
    if { $ptname == $frompoint } {
        set from_time [get_attribute $pt arrival]
    } elseif { $ptname == $topoint } {
        set to_time [get_attribute $pt arrival]
    }
}
set delta_time [expr $to_time − $from_time]
return $delta_time
}
# Title: get_segment_delay_max_fall.proc#
# Description: The procedure provides a max_fall delay
#              calculation between a "from" point and a "to" point

proc get_segment_delay_max_fall { args } {
set results(-from) "NULL"
set results(-to) "NULL"
parse_proc_arguments -args $args results
set frompoint $results(-from)
set topoint $results(-to)
set dtype "max_fall"
set delta_time 0
set from_time 0
set to_time 0
if { $frompoint == "NULL" } {
    set delay_path [get_timing_paths -to $topoint -delay_type
$dtype -max_path 1]
} else {
    set delay_path [get_timing_paths -from $frompoint -to $topoint
-delay_type $dtype -max_path 1]
}
echo "Number of paths is [sizeof_coll $delay_path]"
set pts [get_attribute $delay_path points]
foreach_in_collection pt $pts {
    set ptname [get_attribute [get_attribute $pt object] full_name]
    if { $ptname == $frompoint } {
        set from_time [get_attribute $pt arrival]
    } elseif { $ptname == $topoint } {
        set to_time [get_attribute $pt arrival]
    }
}
set delta_time [expr $to_time − $from_time]
return $delta_time
}
```

Figure 3:
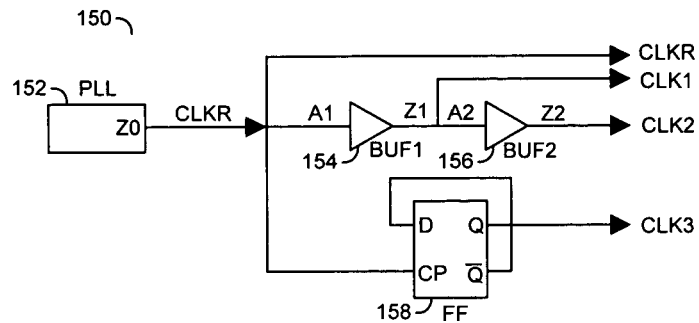
FIG. 3 is a block diagram of an example circuit design used to illustrate an operation of the present invention.

Referring to FIG. 3, a block diagram of an example digital circuit design 150 used to illustrate an operation of the present invention is shown. The digital circuit design 150 generally comprises a circuit (or block) 152, a circuit (or block) 154, a circuit (or block) 156 and a circuit (or block) 158. A clock signal (e.g., CLKR) may be presented at an output (e.g., Z0) of the circuit 152. The clock signal CLKR may be received at an input (e.g., A1) of the circuit 154 and at an input (e.g., CP) of the circuit 158. A clock signal (e.g., CLK1) may be presented at an output (e.g., Z1) of the circuit 154 to an input (e.g., A2) of the circuit 156. A second clock signal (e.g., CLK2) may be presented at an output (e.g., Z2) of the circuit 156. The circuit 158 generally represents a divided by two circuit. A first output (e.g., Q) of the circuit 158 may present a third clock signal (e.g., CLK3). A second output (e.g., /Q) of the circuit 158 may be routed to an input (e.g., D) of the circuit 158.

The circuit 152 may implement a phase lock loop (PLL) circuit. The clock signal CLKR generated by the PLL circuit 152 may operate as the root clock source for the digital circuit design 150. As such, the clock signal CLKR may serve as the root clock signal.

The circuits 154 and 156 may each be implemented as non-inverting buffer (e.g., BUF1 and BUF2). The first clock signal CLK1 generated by the first buffer circuit 154 may be a derived clock signal created directly from the root clock signal CLKR. The second clock signal CLK2 generated by the second buffer circuit 156 may also be a derived clock signal created indirectly from the root clock signal CLKR using the derived clock signal CLK1. Therefore, the derived clock signals CLK1 and CLK2 may have a same frequency (and period) as the root clock signal CLKR but may have different latencies as compared with the root clock signal and each other.

The circuit 158 may be implemented as a divide by two circuit using a flip-flop (FF). The third clock signal CLK3 generated by the divide by two circuit 158 may serve as a third derived clock signal. An arrangement of the divide by two circuit 158 may cause the derived clock signal CLK3 to oscillate at half the frequency of the root clock signal CLKR (e.g., CLK3 frequency=CLKR frequency/2).

The clock definition tool 124 may generate the following scripts and load to the STA tool 104 for the example digital circuit design 150 as follows:

```
create_clock -name ROOT_CLK -period $T -waveform [list 0 $ROOT_WIDTH] PLL/Z0
create_clock -name CLK1 -period $T -waveform [list 0 $CLK1_WIDTH] BUF1/Z1
    set_clock_latency -rise $CLK1_RISE -source CLK1
    set_clock_latency -fall $CLK1_FALL -source CLK1
create_clock -name CLK2 -period $T -waveform [list 0 $CLK2_WIDTH] BUF2/Z2
    set_clock_latency -rise $CLK2_RISE -source CLK2
    set_clock_latency -fall $CLK2_FALL -source CLK2
create_clock -name CLK3 -period $Tmby2 -waveform [list 0 $CLK3_WIDTH] FF/Q
    set_clock_latency -rise $CLK3_RISE -source CLK3
    set_clock_latency -fall $CLK3_FALL -source CLK3
    setpropagated_clock [all-clocks]
```

Figure 4:
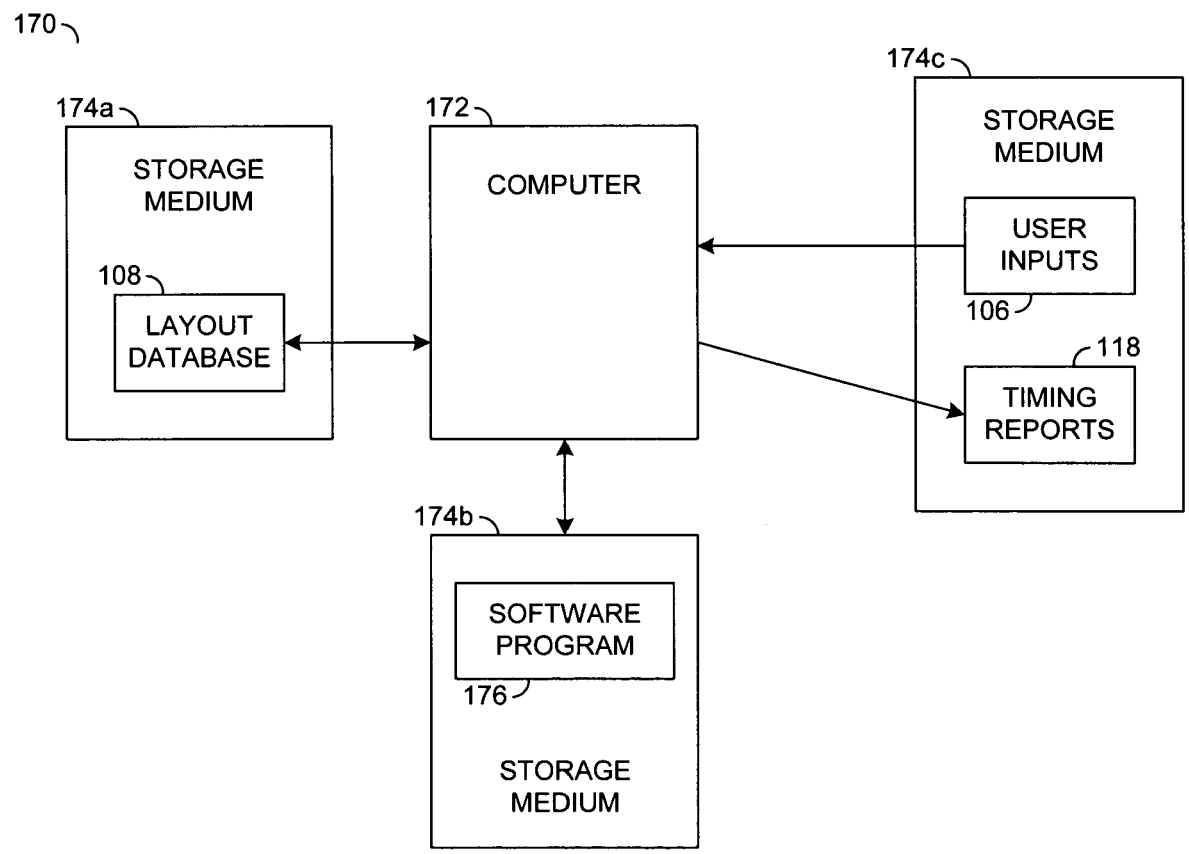
FIG. 4 is a block diagram of an apparatus illustrating an example implementation of the present invention.

Where:

(using notation <circuit n>/<node x> to <circuit m>/<node y> to . . . )
ROOT_WIDTH = αT
CLK1_RISE = PLL/Z0_BUF1/A1_RISE + BUF1/A1_BUF1/Z1_RISE
CLK1_FALL = PLL/Z0_BUF1/A1_FALL + BUF1/A1_BUF1/Z1_FALL
CLK1_WIDTH = ROOT_WIDTH + CLK1_FALL − CLK1_RISE
CLK2_RISE = CLK1_RISE + BUF1/Z1_BUF2/A2_RISE + BUF2/A2_BUF2/Z2_RISE
CLK2_FALL = CLK1_FALL + BUF1/Z1_BUF2/A2_FALL + BUF2/A2_BUF2/Z2_FALL
CLK2_WIDTH = ROOT_WIDTH + CLK2_FALL − CLK2_RISE
CLK3_RISE = PLL/Z0_FF/CP_RISE + FF/CP_FF/Q_RISE -continued CLK3_FALL = PLL/Z0_FF/CP_RISE + FF/CP_FF/Q_FALL, and
CLK3_WIDTH = ROOT_WIDTH + CLK3_FALL − CLK3_RISE Referring to FIG. 4, a block diagram of an apparatus 170 illustrating an example implementation of the present invention is shown. The apparatus 170 may be implemented as a computer 172 in communication with one or more storage mediums 174a–c. The storage medium 174a may store the layout database file 108. The storage medium 174b may store a software program 176. The software program 176 may be an implementation of the analysis tool 102. The software program 176 may be read and executed by the computer 172 to perform the process of analyzing the derived clock signals of a digital circuit design. The storage medium 174c may store the user input file 106 and the timing reports file 118. The STA tool 104 may reside in another storage medium (not shown). In one embodiment, the software program 176, the layout database file 108, the user input file 106 and/or the timing reports file 118 may be stored in the same storage medium.

The present invention generally permits users to express clock signals at design points (locations) as equations. The scripts generated for the clock paths may be used to satisfy specific analysis purposes. The analysis may then be used to debug problems in the digital circuit design.

Benefits of the present invention may include that a single kind of clock may be defined. Skews may be calculated based on locations determined by a designer (user). Pulse widths of the root clock signal CLKR and the derived clock signals (e.g., CLKn) may reflect a simulation waveform. Furthermore, a clock tree may be easily monitored to produce better layout results for the digital circuit design. The same scripts may be applied to a pre-layout static timing analysis and a post-layout static timing analysis. Application of the analysis tool 102 may be relatively simple. Regardless how complex the digital circuit design may be, the script "create_clock" may be used to define the derived clocks. The analysis tool 102 may also provide a high reliability for the static timing analysis. Since the clock parameters may be based on equations, constraint variables entered by the designer may be readily applied to the equations. The static timing analysis performed by the STA tool 104 may also provide accurate results based on the clock definitions generated by the clock definition tool 124. In all cases, the static timing analysis results may match VHSIC hardware description language simulations, for example ModelSim® (produced by the Model Technology company of Wilsonville, Oreg.). In addition, the present invention may provide a convenient method for checking the clock trees. The detail paths of latency calculations may be easily obtained from the clock trees thus allowing for improvements in the layout of the digital circuit design.

The present invention may be used to analyze portions of a code division multiple access (CDMA) chipset utilizing high speed designs that use multiple clock domains. A static timing analysis performed for a new CDMA design may allow layouts to be verified and any deficiencies corrected prior to taping out a new integrated circuit for next generation wireless mobile voice and data applications. The present invention may also be employed by the ASIC engineers to maintain existing CDMA and related designs for integration into larger systems and systems-on-a-chip.

The functions performed by the flow diagram of FIG. 2 and the scripts within the above text may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMS, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for analyzing a circuit design, comprising the steps of:
   (A) determining a plurality of paths from a first clock at a first location to a plurality of second clocks at a plurality of second locations in said circuit design, wherein said second clocks are derived from said first clock;
   (B) calculating a plurality of delays along said paths wherein at least two of said delays are associated with each of said paths; and
   (C) calculating a plurality of latencies with respect to said first clock for said second clocks using said delays.

2. The method according to claim 1, further comprising the step of:
   calculating a particular latency between two of said second clocks as a difference of two of said latencies with respect to said first clock.

3. The method according to claim 1, wherein at least one of said paths is a longest physical distance from said first location to one of said second locations.

4. The method according to claim 1, wherein each of said delays comprise both a rise delay and an associated fall delay along a respective portion among a plurality of portions in each of said paths.

5. The method according to claim 4, wherein at least one of said rise delays is different than said associated fall delay through said respective portion.

6. The method according to claim 1, wherein step (C) comprises the sub-step of:
   calculating a plurality of rise latencies of said latencies for said second clocks by summing a plurality of rise delays of said delays along said paths.

7. The method according to claim 1, wherein step (C) further comprises the sub-steps of:
   calculating a plurality of fall latencies of said latencies for said second clocks by summing a plurality of fall delays of said delays along said paths.

8. The method according to claim 1, further comprising the step of:
   calculating a fall delay of said first clock from a plurality of parameters.

9. The method according to claim 8, wherein said parameters comprise a period, a duty cycle and a rise delay.

10. The method according to claim 1, further comprising the step of:
    calculating a plurality of pulse widths, one of said pulse widths for each of said second clocks using (i) a plurality of rise delays of said delays and (ii) a plurality of fall delays of said delays.

11. The method according to claim 1, further comprising the step of:
    generating a plurality of definitions for said second clocks based on both (i) said latencies of said second clocks and (ii) said delays along said paths.

12. A storage medium for use in a computer for analysis of a circuit design, the storage medium recording a computer program that is readable and executable by the computer, the computer program comprising:
    (A) determining a plurality of paths from a first clock at a first location to a plurality of second clocks at a plurality of second locations in said circuit design with said computer, wherein said second clocks are derived from said first clock;
    (B) calculating a plurality of delays along said paths with said computer, wherein at least two of said delays are associated with each of said paths; and
    (C) calculating a plurality of latencies with respect to said first clock for said second clocks using said delays with said computer.

13. The storage medium according to claim 12, further comprising the step of:
    calculating a particular latency between two of said second clocks as a difference of two of said latencies with respect to said first clock.

14. The storage medium according to claim 12, wherein step (C) comprises the sub-step of:
    calculating a plurality of rise latencies of said latencies for said second clocks by summing a plurality of rise delays of said delays along said paths.

15. The storage medium according to claim 12, wherein step (C) comprises the sub-step of:
    calculating a plurality of fall latencies of said latencies for said second clocks by summing a plurality of fall delays of said delays along said paths.

16. The storage medium according to claim 12, further comprising the step of:
    calculating a first pulse width of said first clock using a period, a duty cycle and a rise delay.

17. The storage medium according to claim 12, wherein step (A) further comprises the sub-step of:
    generating a path file storing said paths by processing a layout of said circuit design read from a layout database.

18. The storage medium according to claim 12, wherein step (B) further comprises the sub-step of:
    generating a delay file storing said delays.

19. An apparatus comprising:
    a clock file;
    a user input file;
    a first tool configured to (i) read at least one parameter for a first clock of a circuit design from said user input file, (ii) generate a plurality of definitions for a plurality of second clocks from said circuit design and said first clock and (iii) store said definitions in said clock file, wherein said second clocks are derived from said first clock; and a second tool configured to (i) read said definitions from said clock file and (ii) generate a timing report for said second clocks by performing a static timing analysis for said circuit design based upon said definitions.

20. The apparatus according to claim 19, wherein said first tool comprises:
a path tool configured to (i) read layout information from a layout database for said circuit design and (ii) generate a path file storing a plurality of paths for said second clocks in response to said layout information.

21. The apparatus according to claim 20, wherein said layout database comprises at least one of a pre-layout database and a post-layout database for said circuit design.

22. The apparatus according to claim 19, wherein said first tool further comprises:
a delay tool configured to (i) read path information for a plurality of paths from a path file, (ii) generate a delay file storing a plurality of delay values along said paths based on said path information and (iii) generate a latency file storing a plurality of latency values for said second clocks based on said path information.

23. The apparatus according to claim 19, wherein said first tool further comprises:
a clock definition tool configured to (i) read a plurality of delay values from a delay file, (ii) read a plurality of latency values from a latency file and (iii) generate said definitions based upon both said latency values and said delay values.

24. The apparatus according to claim 19, wherein said circuit design is at least a portion of a code division multiple access circuit design.

25. An apparatus comprising:
a path tool configured to generate a path file storing a plurality of paths for a plurality of clocks in response to both (i) at least one parameter for a first of said clocks and (ii) a layout database for a circuit design;
a delay tool configured to generate a delay file storing a plurality of delay values along said paths;
a clock definition tool configured to generate a plurality of definitions for said clocks based upon said delay values; and
a static timing analysis tool configured to generate a timing report for said clocks by performing a static timing analysis for said circuit design based upon said definitions.

26. The apparatus according to claim 25, wherein said delay tool is further configured to generate a latency file storing a plurality of latency values for said clocks.

27. The apparatus according to claim 26, wherein said clock definition tool is further configured to generate said definitions for said clocks in further response to said latency values.

* * * * *